(12) United States Patent  (10) Patent No.: US 6,671,181 B2
Kaminski  (45) Date of Patent: Dec. 30, 2003

(54) LATCH FOR SECURING PCI CARD TO A COMPUTER CHASSIS

(75) Inventor: Joseph W. Kaminski, Campbell, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 237 days.

(21) Appl. No.: 10/011,092

(22) Filed: Dec. 6, 2001

(65) Prior Publication Data

US 2003/0107878 A1 Jun. 12, 2003

(51) Int. Cl.[7] .............................. H05K 5/00; H05K 5/04; H05K 5/06
(52) U.S. Cl. .................. 361/759; 361/752; 361/753; 361/755; 361/756; 361/759; 361/801; 361/802; 361/796; 361/825
(58) Field of Search ................................. 361/752, 753, 361/796, 755, 759, 756, 801, 802, 825

(56) References Cited

U.S. PATENT DOCUMENTS

| 5,544,006 A | | 8/1996 | Radloff et al. |
|---|---|---|---|
| 5,601,349 A | * | 2/1997 | Holt ...................... 312/265.6 |
| 5,673,175 A | | 9/1997 | Carney et al. |
| 5,715,146 A | | 2/1998 | Hoppal |
| 5,980,281 A | | 11/1999 | Neal et al. |
| 6,122,176 A | | 9/2000 | Clements |
| 6,158,594 A | | 12/2000 | Boe |
| 6,162,073 A | | 12/2000 | Haq et al. |
| 6,166,902 A | | 12/2000 | Liu |
| 6,185,110 B1 | | 2/2001 | Liu |
| 6,190,204 B1 | | 2/2001 | Huang |
| 6,198,633 B1 | | 3/2001 | Lehman et al. |
| 6,215,668 B1 | | 4/2001 | Hass et al. |
| 6,220,887 B1 | | 4/2001 | Downs |
| 6,421,247 B1 | * | 7/2002 | Fuchimukai ................. 361/759 |
| 6,618,263 B1 | * | 9/2003 | Kin-Wing et al. ........... 361/759 |
| 6,618,264 B2 | * | 9/2003 | Megason et al. ............ 361/759 |

* cited by examiner

Primary Examiner—David Martin
Assistant Examiner—Thanh Yen Tran

(57) ABSTRACT

A latch for selectively locking a bulkhead to a computer chassis. The latch includes a shoulder defining a longitudinal axis, a handle, an engagement body, and a biasing member. The handle extends outwardly from the shoulder and the engagement body extends from the handle opposite the shoulder. The biasing member extends outwardly from the shoulder and includes a compressible intermediate section and a trailing section. The latch is configured to be rotatable about the longitudinal axis between locked and unlocked positions. In the locked position, the engagement body locks the bulkhead to the chassis. Further, the intermediate section of the biasing member biases the trailing section to lodge against the chassis such that the biasing member resists movement from the locked position. In one preferred embodiment, the latch further includes a stop member extending outwardly from the shoulder and configured to contact the chassis in the locked position.

20 Claims, 7 Drawing Sheets

LATCH FOR SECURING PCI CARD TO A COMPUTER CHASSIS

BACKGROUND OF THE INVENTION

The present invention relates to a device for selectively securing a component card within a computer system chassis. More particularly, it relates to a tool-less latch for selectively locking a PCI card bulkhead to a chassis card bay, preferably adapted for low profile chassis applications.

Most modern day computer systems, in particular, computer systems designed for server applications, include a peripheral component interconnect (PCI) system that interconnects one or more microprocessors with selected PCI cards. The PCI cards are each uniquely designed to support a variety of applications and afford a user the ability to tailor the computer system for a desired end-use.

PCI-based computer systems are structurally configured to promote manual insertion/removal of the PCI card. To this end, the computer system generally includes a chassis maintaining various other components, such as microprocessor(s), power supply unit(s), hard disk drive(s), cooling fan(s), etc. In addition, the chassis forms an I/O card bay defining slots sized to receive PCI cards. The card bay accurately positions and maintains individual PCI cards relative to a connector board (or "backplane") for designated interface with the microprocessor(s) via appropriate PCI bus architecture.

A distinct advantage of PCI-based computer systems is the ability to easily remove one or more of the PCI cards for subsequent servicing, exchange, upgrading, etc. As originally conceived, removal of a PCI card from the card bay entailed shutting off power to all of the card bay slots (and thus, all of the inserted PCI cards). More recently, however, PCI-based computer systems are designed to allow removal of one or more PCI cards without an entire system shutdown. This feature is commonly referred to as "hot plug" or "hot swap". For high-end applications, especially server applications, this hot plug attribute is essential.

Various mechanisms have been devised for securely mounting individual cards within the respective slots. As a point of reference, the PCI cards are commonly secured to bulkhead mounting bracket that is otherwise secured to the chassis card bay. With this in mind, early techniques entailed affixing the bulkhead to the chassis with a screw or pin. While viable, this methodology is not conducive to quick-release of the PCI card, and presents a distinct risk that the screw (or other hardware component) might unexpectedly fall into the chassis, leading to component damage. Alternatively, plastic clips have been developed, that, in theory, secure the PCI card to the chassis bay. These plastic clips are formed as part of the PCI card bulkhead, and thus eliminate the concerns associated with loose hardware (e.g., screws). Unfortunately, however, the plastic clip approach may not satisfactorily secure the card to the chassis bay on a consistent basis, and is susceptible to connection failures due to vibrational forces normally encountered during computer operation.

More recent computer server designs are designed to include a separate retention/actuator device that is otherwise mounted to the chassis bay. In general terms, these devices include individual latches that not only "lock" the bulkhead to the chassis, but also initiate a slot power down operation normally required for a hot plug procedure. One example of an available PCI card retention/actuator device is described in U.S. Pat. No. 6,182,173.

In addition to implementation of a hot swap capability in conjunction with an acceptable card bulkhead mounting device, another design goal for future computer/server systems is reducing an overall size of the chassis itself. As a point of reference, the smallest industry-accepted server configuration incorporates a chassis having a "standard" 4 U height. These highly compact servers are commonly employed in "racked" applications, whereby a number of server units are vertically aligned in an appropriately designed rack. A series of these loaded racks are then stored side-by-side in a centralized location. Of course, any reduction in the chassis height would allow additional server units to be stored on a single rack, thereby maximizing use of available space. In this regard, PCI cards have a height of approximately 3 U, so that it may be possible to produce a server unit having a chassis height of less than 4 U. Unfortunately, however, the retention devices described above are incompatible with a 3 U design. That is to say, most available PCI card retention devices have a relatively substantial height, such that when mounted to the chassis bay, the overall height of the chassis unit must exceed 3 U. In fact, unless the original technique of utilizing loose hardware (e.g., a screw) is employed to mount the PCI card bulkhead, the smallest chassis unit height that can be achieved is 3.5 U. This additional 0.5 U requirement effectively results in a 4 U design. Conversely, if screws or other loose hardware are used, an unacceptable risk of component damage arises for the reasons described above.

Manufacturers continually to strive to develop PCI-based computer systems, especially servers, with increased functionality and reduced size. In this regard, hot plug capabilities are universally desired. Unfortunately, existing techniques for securing PCI cards to the chassis bay present unacceptable risks or are not conducive to a 3 U chassis design. Therefore, a need exists for a latch device otherwise permanently mounted to the chassis that consistently locks a PCI card component in place, and preferably satisfies the spacing constraints associated with a 3 U chassis design.

SUMMARY OF THE INVENTION

One aspect of the present invention relates to a latch for selectively locking a PCI bulkhead to a computer chassis bay. The latch includes a shoulder, a handle, an engagement body, and a biasing member. The shoulder defines a longitudinal axis. The handle extends outwardly from the shoulder and defines a front, a back, and a bottom. The engagement body extends from the bottom of the handle opposite the shoulder. Finally, the biasing member extends outwardly from the shoulder adjacent the back of the handle. In this regard, the biasing member includes an intermediate section and a trailing section. The intermediate section extends from the shoulder and is configured to be compressible onto itself. The trailing section, on the other hand, is configured to selectively engage a wall of the chassis bay. The engagement body is configured to selectively engage a PCI bulkhead, thereby locking it relative to the chassis bay. With the above in mind, the latch is configured to be rotatable about the longitudinal axis between a locked position and an unlocked position. In the locked position, the engagement body locks the PCI bulkhead to the chassis bay. Further, the intermediate section of the biasing member biases the trailing section to lodge against the chassis such that the biasing member resists movement from the locked position. Conversely, in the unlocked position, the handle, and thus the engagement body, is rotated away from the PCI bulkhead so that the PCI card can be removed. In one preferred embodiment, the latch further includes a stop member extending outwardly from the shoulder and circumferentially spaced from the handle and the biasing member. In this regard, the stop member is configured to selectively engage a wall of the chassis bay in the locked position, thereby impeding overt rotation of the latch. In another preferred embodiment, the biasing member is a U-shaped body that tapers in cross-sectional profile.

Another aspect of the present invention relates to an enclosure device for a PCI computer system. The enclosure device includes a chassis, a card bay, and a latch. The card bay is formed by the chassis and defines a plurality of card slots, as well as an outer frame portion. The outer frame portion includes a base wall configured to receive a PCI bulkhead and a sidewall extending in a perpendicular fashion from the base wall. The latch is secured to the base wall adjacent one of the slots. In this regard, the latch includes a shoulder, a handle, an engagement body, and a biasing member. The shoulder defines a longitudinal axis. The handle extends outwardly from the shoulder and defines a front, a back, and a bottom. The engagement body extends from the bottom of the handle and is positioned opposite the shoulder. Finally, the biasing member extends outwardly from the shoulder adjacent the back of the handle, and includes a compressible intermediate section and a trailing section. In this regard, the intermediate section is compressible onto itself, whereas the trailing section is configured to selectively engage the sidewall of the chassis card bay. With the above configuration, the latch is rotatable between an unlocked position and a locked position. In the locked position, the handle positions the engagement body so as to lock a PCI bulkhead to the base wall. Further, in the locked position, the trailing section of the biasing member is lodged against the sidewall, with the intermediate section resisting movement of the trailing section from this lodged locked position. In one preferred embodiment, the chassis has a height of 3 U, and the latch is sized to not exceed 3 U spacing requirements. In another preferred embodiment, at least one of the card slots is adapted to be hot pluggable, and at least another one of the other slots is not. In this regard, the latch is color coded so as to signify whether the card slot with which the latch is associated is hot pluggable.

DESCRIPTION OF THE PREFERRED EMBODIMENTS

Figure 1:
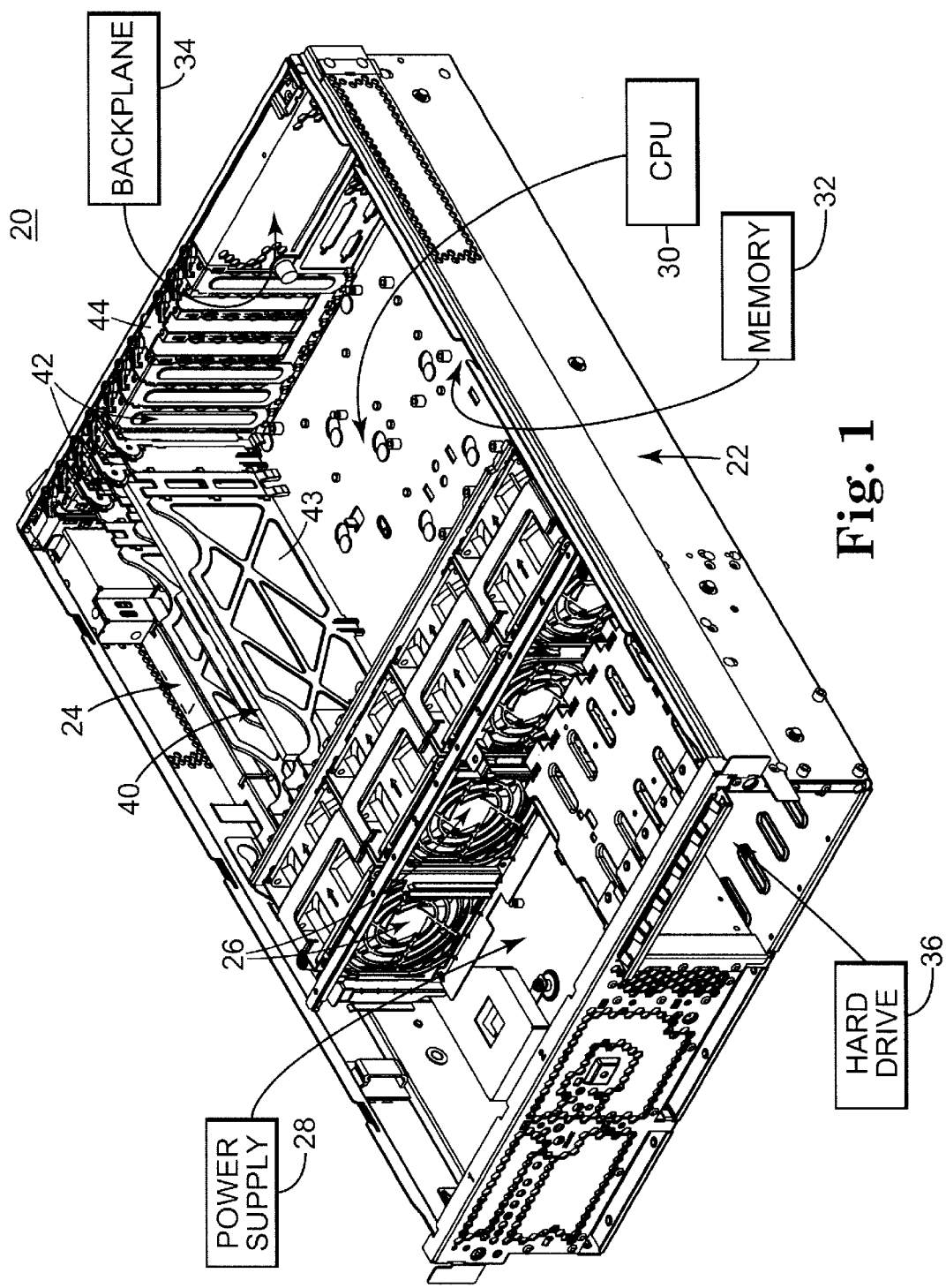
FIG. 1 is a perspective view of a computer system with portions shown in block form.

The present invention relates to a latch useful with a computer system, one example of which is shown at 20 in FIG. 1. In general terms, the computer system 20 includes a chassis 22 maintaining a variety of components and forming an input/output card bay 24 (referenced generally). The internal components will vary depending upon the particular format of the computer system 20. In a preferred embodiment, however, the computer system 20 is a high-end computer, more preferably, a server computer, that includes a cooling fan(s) 26, a power supply unit(s) 28, a central processing unit(s) (CPU) or microprocessor(s) 30, a memory 32, a backplane control board 34, and hard drive(s) 36. For ease of illustration, each of the components 28–36 are shown in block form, and arrows are provided to indicate generally a location of the particular component 28–36 relative to the chassis 22 in one preferred embodiment. Once again, other configurations, including additional internal components, are equally acceptable for the computer system 20.

Regardless of exact layout, the computer system 20 is a PCI-based system, whereby PCI cards (one of which is shown in diagrammatical form at 40) are connected to the backplane 34. Thus, the backplane 34 includes appropriate PCI bus architecture. The card bay 24 defines a plurality of slots 42 that receive respective ones of the PCI cards 40 such that the cards 40 are properly coupled or "plugged" to the backplane 34 upon insertion. Circuitry (not shown) selectively provides power to each of the individual slots 42. In this regard, the computer system 20 is configured such that at least one of the slots 42 is hot plug compliant. As previously described, the PCI hot plug feature of the computer system 20 affords a user the ability to remove one of the PCI cards 40 from the associated slot 42 without requiring powering down or re-booting of the entire computer system 20. Finally, FIG. 1 illustrates shields or dividers 43 (three of which are shown in FIG. 1) that generally serve to electrically isolate adjacent PCI cards otherwise loaded into the card bay 24. Certain preferred features of the shields 43 are described below.

Figure 2:
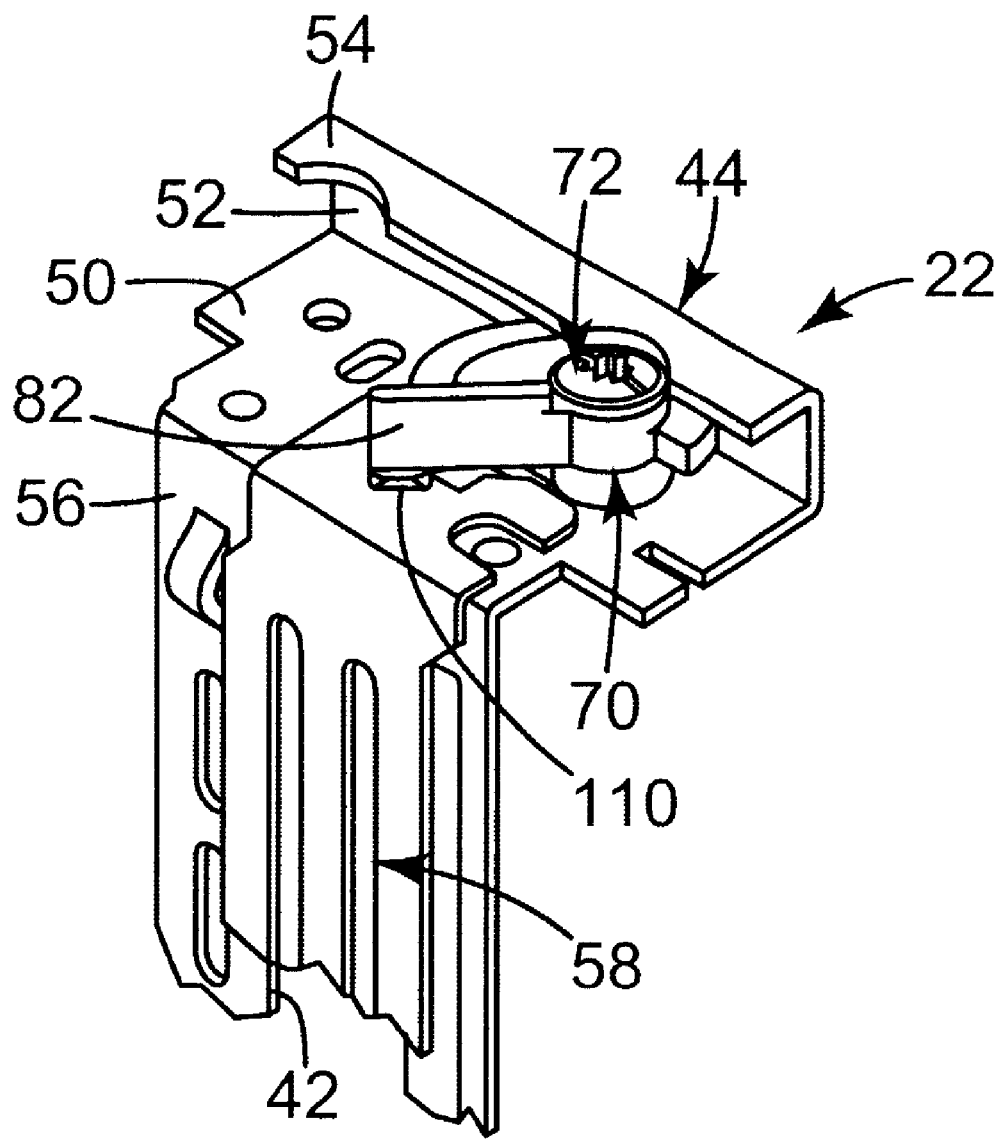
FIG. 2 is an enlarged, perspective view of a portion of FIG. 1 including a latch in accordance with the present invention.

In addition to maintaining varying components, the chassis 22 can assume a variety of different sizes. In one preferred embodiment, however, the chassis 22 has a height of 3 U (approximately 5.25 inches). This highly compact design has heretofore been unavailable due, in part, to the technique by which the PCI cards 40 are secured within the respective slots 42. As a point of reference, the chassis 22 includes an upper portion 44 (relative to the orientation of FIG. 1) adapted to receive and maintain a portion of the PCI cards 40. In particular, and with additional reference to FIG. 2, the upper portion 44 of the chassis 22 includes a base wall 50, a sidewall 52, and a flange 54. The upper portion 44 extends from a containment wall 56 that otherwise forms the slots 42 (one of which is shown in FIG. 2). The base wall 50 extends in a substantially perpendicular fashion from the containment wall 56 as shown. In this regard, and as is known in the art, the base wall 50 and the containment wall 56 are formed to receive a bulkhead 58 otherwise maintaining the PCI card 40 (FIG. 1). The sidewall 52 extends in a substantially perpendicular fashion from the base wall 50. Finally, the flange 54 extends from the sidewall 52 in a substantially perpendicular fashion, opposite the base wall 50 as shown. In one preferred embodiment, an extension of the sidewall 52 between the base wall 50 and the flange 54 conforms with standard 3 U chassis height constraints.

With the above space constraints in mind, the present invention provides a latch 70 configured to selectively mount the PCI bulkhead 58, and thus the PCI card 40 (FIG. 1), to the chassis 22. In general terms, the latch 70 is rotatably affixed to the chassis 22 by a coupling device 72 (e.g., screw, rivet, pin, etc.), and is maneuverable between a locked position (shown in FIG. 2) and an unlocked position (described in greater detail below). In the locked position, the latch 70 positively secures the PCI bulkhead 58 to the chassis 22, and in particular the base wall 50. Conversely, in the unlocked position, the PCI bulkhead 58 is released from the latch 70 such that the PCI card 40 (FIG. 1) can be removed from the associated slot 42.

Figure 3:
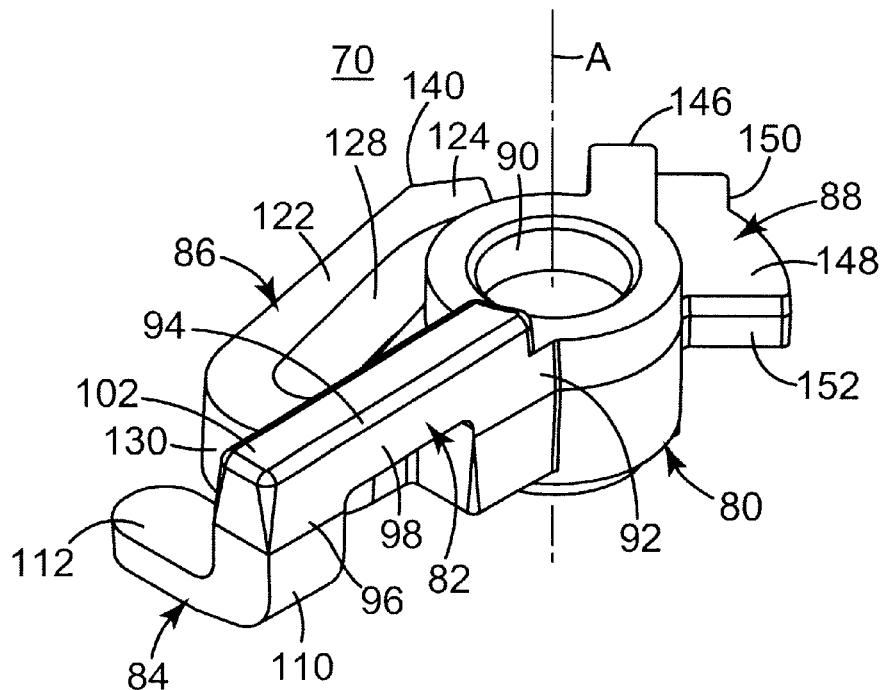
FIG. 3 is a top, perspective view of the latch of FIG. 2.
Figure 4:
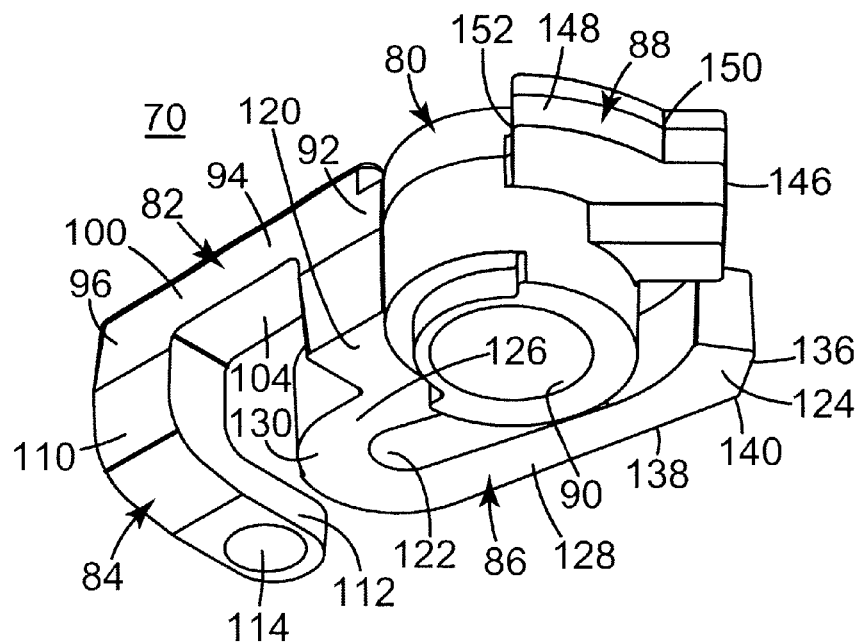
FIG. 4 is a bottom perspective view of the latch of FIG. 2.

The latch 70 is shown in greater detail in FIGS. 3 and 4. In one preferred embodiment, the latch 70 includes a shoulder 80, a handle 82, an engagement body 84, a biasing member 86, and a stop member 88. In general terms, the handle 82 extends outwardly from the shoulder 80. The engagement body 84 extends in a rearward fashion (relative to the orientation of FIG. 3) from the handle 82 opposite the shoulder 80. The biasing member 86 extends outwardly from the shoulder 80 adjacent the handle 82. Finally, the stop member 88 extends outwardly from the shoulder 80, and is circumferentially spaced from the handle 82 and the biasing member 86. During use, the latch 70 is rotatable about a longitudinal axis A defined by the shoulder 80. In particular, a user maneuvers the handle 82 so as to rotate the latch 70 about the longitudinal axis A in a desired fashion to force the engagement body 84 onto or away from the PCI bulkhead 58 (FIG. 2). In this regard, the biasing member 86 is configured to lodge against the chassis 22 in the locked position such that the latch 70 resists movement from this locked position.

The shoulder 80 is preferably a generally cylindrical body defining a central passage 90 extending along the central axis A. The central passage 90 is sized to receive the coupling device 72 (FIG. 2). As best shown in FIG. 2, the shoulder 80 in combination with a leading portion of the coupling device 72 (such as a head of a screw) defines an overall height of the latch 70. In one preferred embodiment, the shoulder 80 has a height selected to satisfy the spacing constraints of a standard 3 U chassis height.

The handle 82 extends outwardly in a generally radially fashion from the shoulder 80. In this regard, the handle 82 includes a first end 92, a central portion 94, and a second end 96. The first end 92 is connected to the shoulder 80, with the second end 96 terminating opposite the shoulder 80. Further, the handle 82 defines a front 98, a back 100, a top 102, and a bottom 104. As a point of reference, directional terminology such as "front," "back," "top," and "bottom" are with reference to the orientation of the latch 70 shown in FIG. 3, and are used for purposes of illustration only. That is to say, the latch 70 can be oriented in a wide variety of positions, such that the directional terminology is in no way limiting.

In a preferred embodiment, the first end 92 has a height contiguous with a height of the shoulder 80. The central portion 94 projects upwardly (relative to an orientation of FIGS. 3 and 4), thereby providing additional surface area for interaction by a user. Further, the bottom 104 of the central portion 94 is preferably formed to have a reduced thickness as compared to the first and second ends 92, 96. With this one preferred configuration, then, the handle 82 more readily deflects along the central portion 94 such that when the engagement body 84 is positioned over the bulkhead 58 (FIG. 2), the handle 82 will deflect to accommodate varying bulkhead thicknesses as described in greater detail below. Finally, in one preferred embodiment, the latch 70 is preferably configured for use with a "standard" PCI card spacing arrangement, whereby individual slots 42 (FIG. 1) are spaced by either 0.8 or 0.9 inch depending upon whether a separate divider component is required. That is to say, a diameter of the shoulder 80 in combination with a length of the handle 82 preferably conforms to standard PCI pitch/spacing design.

The engagement body 84 extends from the bottom 104 of the handle 82. In particular, the engagement body 84 extends from the bottom 104 of the second end 96, and is positioned opposite the shoulder 80. With respect to the orientation of FIG. 3, the engagement body 84 extends rearwardly relative to the back 100 of the handle 82 and defines a leading region 110 and a trailing region 112. An outer surface of the leading region 110 is preferably curved or tapered so as to not present a distinct corner that may otherwise impede movement over the PCI bulkhead 58 (FIG. 2). Further, the trailing region 112 projects to a plane slightly below that of the leading region 110, and defines a heel 114. Once again, by positioning the leading region 110 slightly "above" the trailing region 112, the engagement body 84 is more easily directed over the PCI bulkhead 58 as the handle 82 is moved in a counter-clockwise direction (relative to the orientation of FIG. 3). Further, the heel 114 is preferably formed to be highly planar, providing an enlarged surface area for consistently engaging a PCI bulkhead 58. With this in mind, relative to the front 98 of the handle 82, the engagement body 84 extends rearwardly so as to preferably position the heel 114 approximately away from the handle 82. Regardless of an exact dimension, by preferably offsetting the heel 114 from the handle 82, the engagement body 84 will readily deflect upon engaging the bulkhead 58, thereby accounting for different bulkhead thicknesses.

The biasing member 86 extends from the shoulder 80 and is defined by a leading section 120, an intermediate section 122, and a trailing section 124. The leading section 120 is connected to the shoulder 80. In a preferred embodiment, the leading section 120 is positioned below the first end 92 of the handle 82 as shown in FIGS. 3 and 4. Regardless, the intermediate section 122 extends from the leading section 120, and terminates at the trailing section 124. The intermediate section 122 is configured to be compressible from a natural state as otherwise illustrated in FIGS. 3 and 4. That is to say, the intermediate section 122 can deflect from the natural state or position shown to a compressed state whereby the trailing section 124 is less spaced from the shoulder 80.

In one preferred embodiment, the intermediate section 122 is a U-shaped member defined by a first leg 126 and a second leg 128. A transition region 130 between the first and second legs 126, 128 allows the second leg 128 to selectively "compress" toward the first leg 126, and thus, the shoulder 80. Notably, the transition region 130 is positioned so as to not interfere with a rearward extension of the engagement body 84. Further, the intermediate section 122 has a decreasing cross-sectional profile from the first leg 126 to the second leg 128. As described in greater detail below, during use, this preferred cross-sectional profile facilitates a more uniform force or stress distribution along the biasing member 86.

The trailing section 124 provides an outer surface 136 configured to selectively lodge against a portion of the chassis 22 (FIG. 2) as described in greater detail below. The outer surface 136 combines with an outer surface 138 of the second leg 128 to define a cam surface 140. As described below, the cam surface 140 interacts with the chassis 22 (FIG. 2) to transition the biasing member 86 in a desired fashion as the latch 70 is rotated between the locked and unlocked positions. In this regard, the respective outer surfaces 136, 138 are planar or linear, with the outer surface 136 of the trailing section 124 extending at an angle relative to the outer surface 138 of the second leg 128.

The stop member 88 extends outwardly from the shoulder 80 and is preferably circumferentially spaced from the handle 82 and the biasing member 86. The stop member 88 preferably forms an engagement face 146 and a guard plate 148. The engagement face 146 provides a relatively flat surface for engaging the chassis 22 (FIG. 2) with the latch 70 in the locked position, thereby preventing over-rotation of the latch 70. As a point of reference, the engagement face 146 and the outer surface 136 of the trailing section 124 are configured to be co-planar in the locked position via interaction with the chassis 22 as described below.

The guard plate 148 is formed forward of the engagement face 146, and defines a radial step 150 and a forward face 152. In general terms, the guard plate 148 is preferably provided to selectively engage an actuator device otherwise associated with a hot pluggable slot as described in greater detail below, with the radial step 150 facilitating positioning of two side-by-side latches 70 in unlocked positions under certain circumstances. In particular, the forward face 152 is positioned relative to the front 98 of the handle 82 such that the latch 70 cannot be moved from an unlocked state without first removing the actuator device, that otherwise initiates powering down of the slot 42 (FIG. 2) with which the latch 70 is associated. Alternatively, however, where this blocking feature is not required, the guard plate 148 is not necessary. Further, where over-rotation of the latch 70 is of less concern, the stop member 88 can be eliminated entirely.

The various components 80–88 of the latch 70 are preferably integrally formed as a singular or unitary body. In one preferred embodiment, the latch 70 is a plastic injection molded part, for example, injection molded polycarbonate. Alternatively, other manufacturing techniques and/or materials are acceptable. In one preferred embodiment, however, the latch 70 provides a visual indication of the hot swap formatting of the slot 42 (FIG. 1) to which the latch 70 is associated. In general terms, not every slot 42 will be hot pluggable. In other words, depending upon the configuration of the computer server 20 (FIG. 1), some of the slots 42 may be hot pluggable for on demand exchange of the PCI card 40 (FIG. 1) inserted therein, whereas others of the slots 42 maintain the respective card 40 on a more permanent basis, and therefore are not hot pluggable. With this background in mind, the latch 70 is preferably configured to indicate whether or not a particular slot 42 is hot pluggable. In one preferred embodiment, the latch 70 is color coded to visually indicate the hot pluggable characteristic of the associated slot. For example, where the latch 70 is formed of an injection molded plastic, a dye or pigment can be added to provide the desired color-coding effect. For example, in one preferred embodiment, the latch 70 is formed to have a purple color indicating the slot 42 is hot swappable, whereas a blue color is used for non-hot swappable slots. Alternatively, a variety of other color schemes are equally acceptable.

Figure 5A:
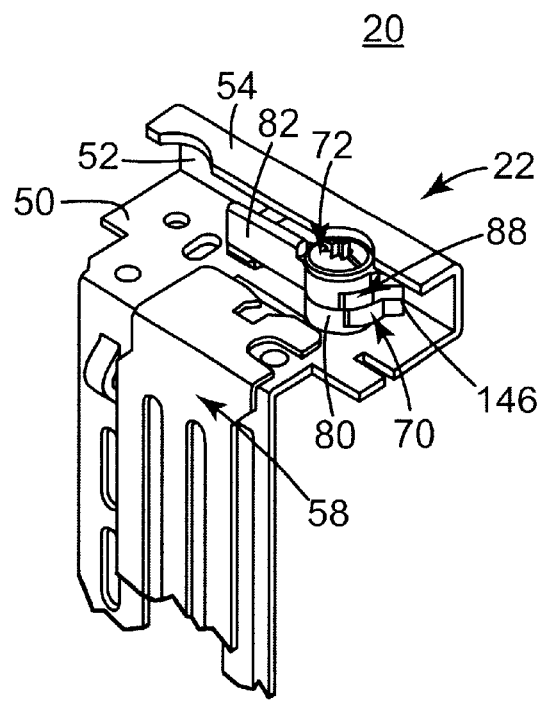
FIG. 5A is a top, perspective view of the latch of FIG. 2 assembled to a chassis, with the latch in an unlocked position.
Figure 5B:
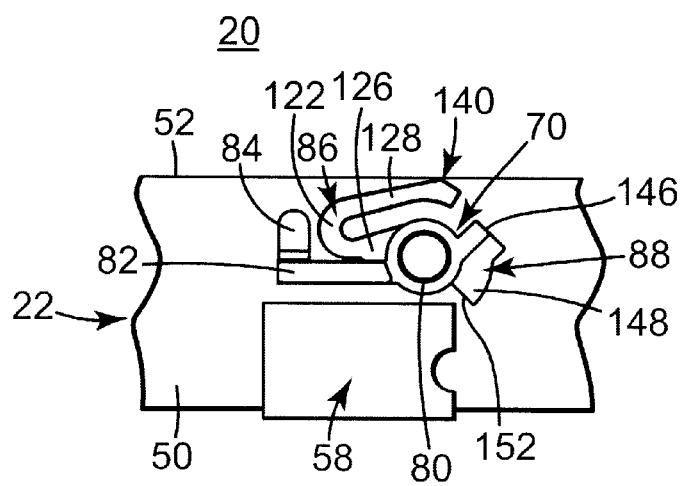
FIG. 5B is a top view of FIG. 5A.

The latch 70 is assembled to the chassis 22 as shown, for example, in FIGS. 5A, 5B. As a point of reference, the latch 70 is shown in the unlocked position in FIGS. 5A and 5B. Further, the flange 54 of the chassis 22 is removed from the view of FIG. 5B to better illustrate a relationship of the latch 70 relative to the sidewall 52. As previously described, the coupling device 72 extends through the shoulder 80, rotatably mounting the latch 70 to the base wall 50. In the unlocked position, the handle 82 is rotated toward the sidewall 52 such that the engagement body 84 is away from the region of the base wall 50 at which the PCI bulkhead 58 is mounted. The biasing member 86 is in a natural or uncompressed state such that the biasing member 86 does not resist or impede movement of the handle 86 to the unlocked position. In this regard, the cam surface 140 (best shown in FIG. 5B) may contact the sidewall 52, but the intermediate section 122 is not overtly compressed. Finally, the engagement face 146 of the stop member 88 is spaced from the sidewall 52 as shown in FIG. 5B. The guard plate 148 and in particular the forward face 152 is positioned over the base wall 50 away from the flange 54. The significance of this position is made clear below.

Figure 6:
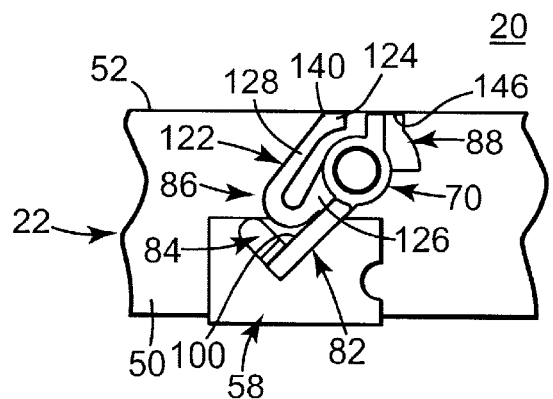
FIG. 6 is a top view of the assembly of FIG. 2, including the latch in a locked position.

Following placement of the bulkhead 58 onto the base wall 50 as shown in FIG. 5A, the latch 70 is then maneuvered to the locked position as shown in FIG. 2. For further clarification, FIG. 6 is additionally referenced, whereby the latch 70 is depicted as assembled to the chassis 22 with the flange 54 removed. In the locked position, the latch 70, and in particular the handle 82, is rotated counter-clockwise (relative to the orientation of FIG. 5A) such that the engagement body 84 nests on top of the bulkhead 58. In this regard, the curved or tapered nature of the leading region 110 of the engagement body 84 facilitates a smooth transition of the engagement body 84 onto the bulkhead 58. The engagement body 84 is effectively wedged against the bulkhead 58 via the coupling device 72 mounting the shoulder 80 to the chassis 22. In other words, the attachment of the shoulder 80 to the base wall 50 generates a downward force (relative to the orientation of FIG. 2) via the handle 82. Rearward extension of the engagement body 84 relative to the back 100 of the handle 82 allows the engagement body 84 to deflect slightly upwardly, thereby accommodating thickness variations in the bulkhead 58.

In addition to applying a downward "locking" force onto the bulkhead 58, the latch 70 is configured to resist unexpected movement from the locked position. The trailing section 124 of the biasing member 86 lodges against the sidewall 52 of the chassis 22 in the locked position as best shown in FIG. 6. As compared to the "natural" state of the biasing member 86 shown in FIG. 5B, in locked position, the biasing member 86 is compressed onto itself, thereby biasing the trailing section 124 to the position shown in FIG. 6. In the locked position, then, the intermediate section 122 resists dislodgement of the trailing section 124 relative to the sidewall 52 (e.g., clockwise movement relative to the orientation of FIG. 6), such that normal vibrations normally encountered during use of the computer system 20 (FIG. 1) will not cause accidental unlocking of the latch 70, and thus connection problems with the associated PCI card 40. Of course, a clockwise moment force applied by a user can be employed to transition the latch 70 back to the unlocked position (FIG. 5A) when removal of the PCI card 40 is desired. Notably, the preferred configuration of the latch 70, and in particular the biasing member 86, requires considerably more force to initiate movement from the locked position than to initiate movement from the unlocked position. That is to say, a user can more easily lock the latch 70 than unlock. In this regard, by varying a stiffness of the biasing member 86 and/or an angle defined by the trailing section 124, the moment force required to initiate movement from the locked position can be controlled to a desired level.

A comparison of the views of FIGS. 5B and 6 best illustrates the preferred compression of the biasing member 86 dictated by the cam surface 140. As the latch 70 is transitioned from the unlocked position (FIG. 5B) to the locked position (FIG. 6) (e.g., counter-clockwise rotation relative to the orientation of FIG. 5B), the cam surface 140 rides along the sidewall 52. In particular, as the latch 70 is rotated from the unlocked position, the cam surface 140 is forced against the sidewall 52, causing the second leg 128 to deflect toward the first leg 126. Upon reaching the locked position, a majority of this compression force is removed, such that the second leg 128 deflects back toward the natural state, or away from the first leg 126. This action, in turn, lodges the trailing section 124 against the sidewall 52. In a preferred embodiment, an audible "snapping" noise is generated by forced contact between the trailing section 124 and the sidewall 52, thereby indicating to a user that the desired locked position has been achieved. To ensure that the latch 70 is not rotated beyond this preferred locked position, the stop member 88, and in particular the engagement face 146, is positioned to similarly engage the sidewall 52, thereby preventing over-rotation of the latch 70 (e.g., further counter-clockwise rotation relative to the position of FIG. 6).

The latch 70 of the present invention uniquely satisfies the spacing constraints presented by limited height chassis designs, and thus can be incorporated into a 3 U layout. Further, the latch 70 reinforces the locked position of the latch 70 via the biasing member 86 as described above. As a point of reference, it has been found that the latch 70 will maintain the locked position at vibrational frequencies in excess of those expected during normal operation of the computer system 20.

Figure 7:
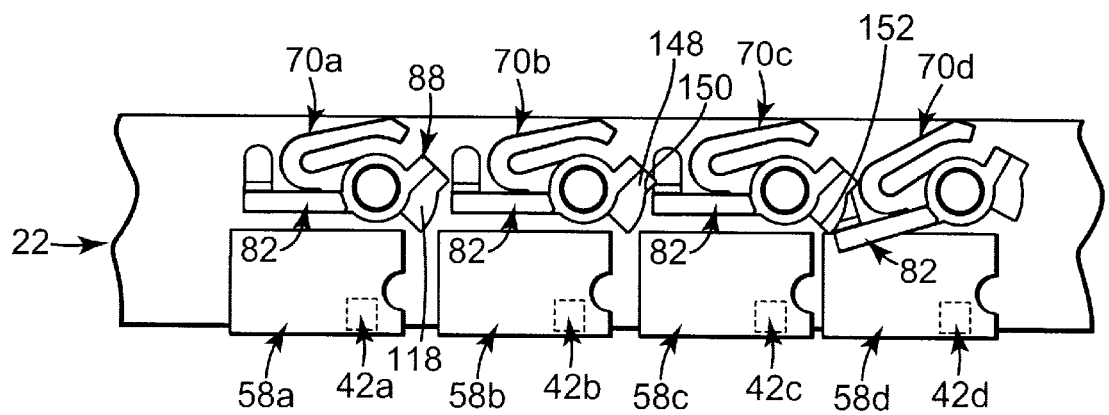
FIG. 7 is a top view of four latches in accordance with the present invention assembled in a side-by-side fashion to a chassis.

As previously described, the latch 70 is preferably adapted for use with hot pluggable and non-hot pluggable slots. To this end, FIG. 7 illustrates a portion of the chassis 22 forming a plurality of slots 42a–42d (referenced generally), along with a plurality of latches 70a–70d mounted to the chassis 22 and associated with respective ones of the slots 42a–42d. With the embodiment of FIG. 7, the first and second slots 42a, 42b are hot swappable, whereas the third and fourth slots 42c, 42d are non-hot swappable. Following installation, each of the slots 42a–42d are loaded with a respective PCI card (not shown), and the latches 70a–70d rotated over the respective bulkheads 58a–58d to the locked position. In the locked position, a side-to-side spacing of the respective latches 70a–70d is of little concern in that the respective handles 82 are positioned linearly away from one another. However, in the unlocked positions (or "attempted" unlocked position relative to the fourth latch 70d) of FIG. 7, the respective handles 82 are oriented in close proximity to an adjacent latch 70a–70d. Thus, for example, the handle 82 of the second latch 70b is rotated into close proximity with the stop member 88 of the first latch 70a. In this regard, a center-to-center spacing associated with hot pluggable slots (such as the slot 42a relative to the slot 42b) is typically 0.9 inch so as to accommodate the divider or shield 43 shown in FIG. 1 (but omitted from the view of FIG. 7). With this spacing in mind, FIG. 7 illustrates that the latch 70 is preferably configured such that the guard plate 148 of the first latch 70a in the unlocked position does not interfere with the handle 82 of the second latch 70b. Thus, PCI cards in both of the hot pluggable slots 42a, 42b can simultaneously be removed.

Additionally, the latch 70 of the present invention is further preferably configured to such that two adjacent latches associated with hot plug compliant slot and a non-hot pluggable slot, respectively, can both be transitioned to an unlocked position at the same time. For example, the guard plate 148 of the second latch 70b in the unlocked position, and in particular the radial step 150, permits movement of the third latch 70c to an unlocked position. In other words, the handle 82 of the third latch 70c "fits" within the radial step 150 of the second latch 70b such that both latches 70b, 70c can co-exist in an unlocked position.

Conversely, the stop member 88 preferably does not permit adjacent latches otherwise associated with non-hot pluggable slots to co-exist in an unlocked position. As a point of reference, it is generally preferred that only one non-hot pluggable card/component be exchanged at a time. The latch 70 of the present invention ensures that this preferred operational technique is followed by preferably configuring the stop member 88 to impede full movement of an adjacent latch associated with a non-hot pluggable slot to be moved to an unlocked position. With specific reference to FIG. 7, it will be recalled that slots 42c, 42d are non-hot pluggable. According to industry standards, the non-hot swappable slots 42c, 42d are formed at a center-to-center spacing (or pitch) of 0.8 inch. With the third latch 70c in the unlocked position, it is seen in FIG. 7 that the fourth latch 70d cannot be fully rotated to an unlocked position. Instead, under the constraints of a 0.8 inch center-to-center spacing, the handle 82 of the fourth latch 70d contacts the forward face 152 of the stop member 88 of the third latch 70c. Thus, following installation and with all latches 70a–70d initially in the locked position, a user can remove only a single one of the PCI cards or other components (not shown) associated with either of the slots 42c, 42d at any one time. For example, the PCI card associated with the slot 42c can be removed by rotating the corresponding latch 70c to the unlocked position as shown. Were the user to attempt to simultaneously remove the PCI card or component associated with the slot 42d, however, the latch 70d could not be rotated to the unlocked position for the reasons described above. Instead, with the latch 70c in the unlocked position, the latch 70d would remain at least partially engaged over the bulkhead 58d associated with the PCI card or component in the slot 42d. As a result, the user would be required to load another PCI card or component into the slot 42c and rotate the third latch 70c to the locked position before a subsequent removal operation could be carried for the slot 42d.

Yet another preferred feature of the latch 70 is best described with reference to FIGS. 8A and 8B that depict a portion of a computer system 160 including a plurality of latches 70a–70c. The computer system 160 is highly similar to that previously described, and includes a chassis 162 forming slots 164a–164c (referenced generally in FIGS. 8A and 8B) each sized to receive a PCI card (not shown) that is otherwise attached to a bulkhead 166a–166c. With the embodiment of FIGS. 8A and 8B, the slots 164 are hot plug compliant. In this regard, the computer system 160 is configured to assist a user in properly performing a hot swap operation whereby the hot swappable slots 164a–164c are "powered down" prior to removing an associated PCI card.

As a point of reference, each of the hot plug compliant slots 164a–164c includes a shield or divider 168a–168c that serves to electrically isolate adjacent PCI cards (not shown). With the embodiment of FIGS. 8A and 8B, the shields 168a–168c are modified to include a pivotable actuator device 170a–170c in combination with an optical sensor device (not shown) that is otherwise positioned below a base wall 172 of the chassis 162 to dictate a desired powering state of each slot 164a–164c. The optical sensor device can assume a variety of forms, but preferably includes a combination optical sensor and a mechanical linkage for each slot 164a–164c. The linkage includes a first end that is accessible through an opening 174a–174c in the base wall 172. One opening 174a–174c provided for each of the slots 164a–164c. A second end of the linkage is positioned to be selectively sensed by the optical sensor that in turn prompts a power on or power off condition for the slot 164 otherwise associated with the particular optical sensor/mechanical linkage. For example, when the optical sensor associated with the slot 164a "senses" the corresponding linkage, the slot 164a is powered off, whereas when the linkage is not sensed, the slot 164*a* is powered on. The linkage is biased to a power off position, and is translated to a power on position via placement of the corresponding actuator device 170*a* within the opening 174*a*. In this regard, the actuator device 170*a*–170*c* can be a flag-like body that is otherwise pivotably connected to the shield 168*a*–168*c*, and includes a post 178*a*–178*c* (best shown in FIG. 8B) that is otherwise sized to selectively nest within the corresponding opening 174*a*–174*c* and engage the linkage (as shown in FIG. 8A).

In general terms, when the actuator device 170*a*–170*c* is positioned to place the post 178*a*–178*c* within the corresponding opening 174*a*–174*c* and thus contacts the linkage (not shown), the corresponding optical sensor (not shown) is prompted to signal appropriate circuitry within the computer system 160 that the slot 164*a*–164*c* associated with the optical sensor should be powered on. FIG. 8A illustrates each of the actuator devices 170*a*–170*c* in the powered on position. Conversely, when the actuator device 170*a*–170*c* is maneuvered such that the post 178*a*–178*c* is away from the corresponding opening 174*a*–174*c*, the optical sensor is prompted to signal a power off condition. FIG. 8B illustrates each of the actuator device 170*a*–170*c* in the power off position. With this in mind, then, a proper hot swap operation entails first removing desired the actuator device 170*a*–170*c* from the respective opening 174*a*–174*c* such that the computer system 160 powers down the corresponding slot 164*a*–164*c*. The PCI card (not shown) can then be safely removed from the slot 164*a*–164*c*. The preferred latch 70 design ensures that this methodology is followed. In particular, in the locked position of FIG. 8A, the guard plate 148 is in close proximity to the corresponding actuator device 170*a*–170*c*. Thus, were an attempt made to maneuver the latch 70*a*–70*c* to the unlocked position without first removing the actuator device 170*a*–170*c*, the forward face 152 of the guard plate 148 would contact the actuator device 170*a*–170*c*, impeding further movement. In other words, the latch 70*a*–70*c* cannot be moved to the unlocked position without first removing the actuator device 170*a*–170*c* (and thus first prompting a powering down of the slot 164*a*–164*c*).

By way of a specific example to the slot 164*a*, the preferred hot swap operation dictated by the latch 70*a* of the present invention is as follows. Initially, the latch 70*a* associated with the slot 164*a* is in the locked position of FIG. 8A, with the latch 70*a* securing the bulkhead 166*a* to the chassis 162. Further, the actuator device 170*a* associated with the shield 168*a* is rotated to the power on position in which the post 178*a* is within the opening 174*a* otherwise associated with the slot 164*a*. Proper hot swap removal of the PCI card (not shown) otherwise positioned within the slot 164*a* requires that the slot 164*a* first be powered down. This is accomplished by rotating the actuator device 170*a* to the powered off position of FIG. 8B in which the post 178*a* is removed from the opening 174*a*. This action allows the mechanical linkage (not shown) associated with the slot 164*a* to transition to a natural, powered off position in which the corresponding optical sensor (not shown) no longer "senses" the linkage. The optical sensor, in turn, signals the computer system 160 to power down the slot 164*a*. The latch 70*a* is then rotated to the unlocked position of FIG. 8B, so that the bulkhead 166*a* (and attached PCI card) can be removed from the slot 164*a*.

Figure 8A:
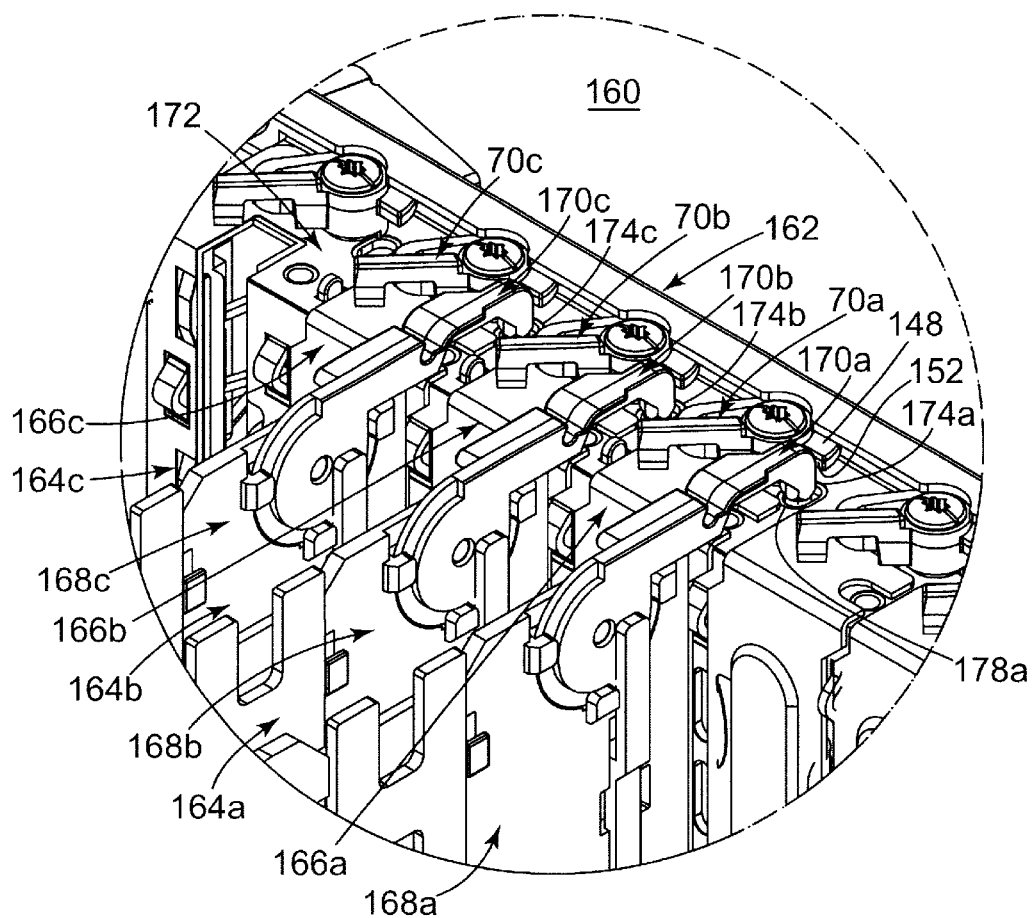
FIGS. 8A and 8B are top, perspective views of latches in accordance with the present invention assembled to a chassis bay including hot pluggable slot with dividers.
Figure 8B:
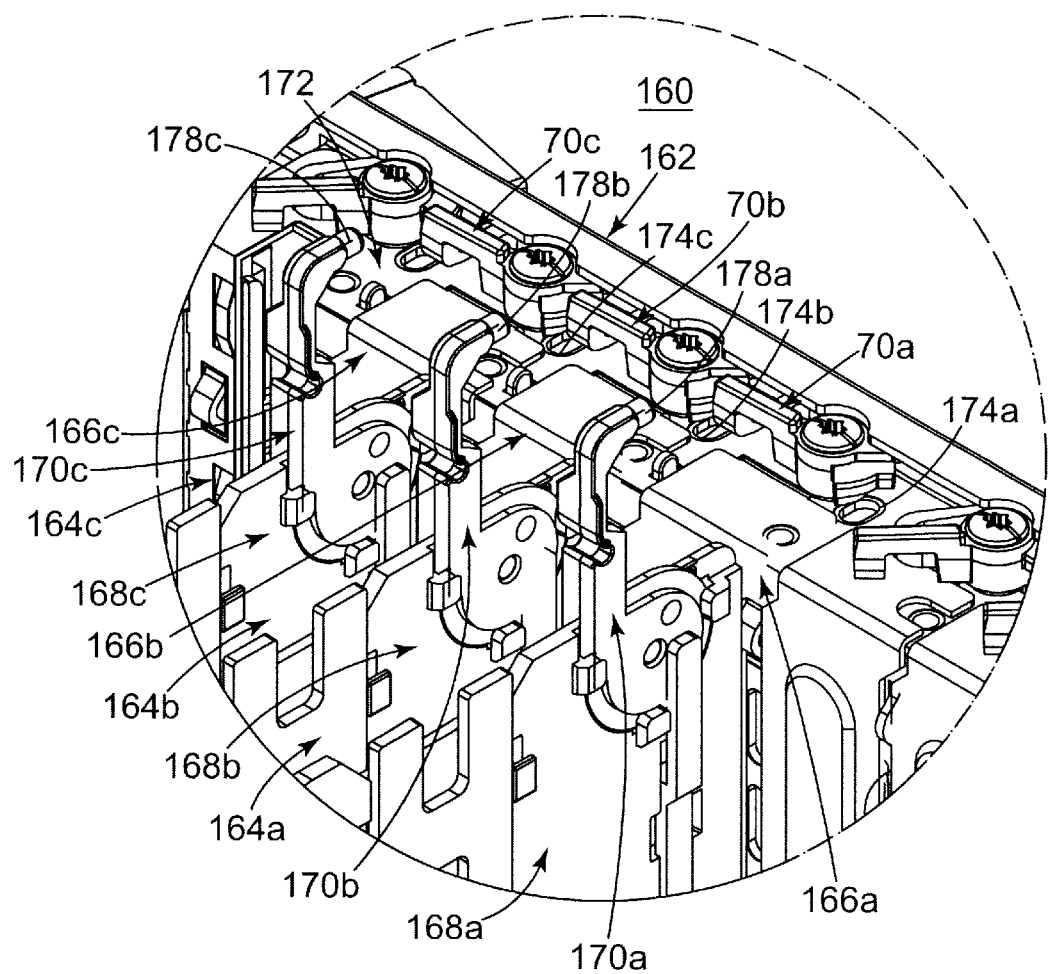

Once again, the interaction between the latch 70*a* and the actuator device 170*a* in the locked position and powered on state of FIG. 8A prevents removal of the PCI card with the slot 164*a* powered on. The bulkhead 166*a* (and thus the attached PCI card) cannot be removed without first transitioning the latch 70*a* and the actuator device 170*a* to the unlocked position. Further, the latch 70*a* cannot be moved to the unlocked position without first raising the actuator device 170*a* that in turn causes the slot 164*a* to be powered down. Thus, the latch 70 and actuator device 170 design of the present invention dictates a fool proof method for ensuring that the hot plug procedure is properly performed.

The latch of the present invention provides a marked improvement over previous designs. First, the latch is uniquely suited for low profile applications, while eliminating the concerns associated with loose screws or bolts normally employed. In one preferred embodiment, the latch satisfies the spacing constraints presented by a 3 U chassis design. Further, the latch consistently resists movement from a locked position such that the latch will not fail under normal operation conditions. Finally, the latch of the present invention is uniquely adapted to satisfy the concerns associated with proper PCI card hot swap operations.

Although the present invention has been described with reference to preferred embodiments, workers skilled in the art will recognize that changes can be made in form and detail without departing from the spirit and scope of the present invention. For example, while the latch has been described as being used with a 3 U chassis, the latch is equally applicable to any chassis size.

What is claimed is:

1. A latch for selectively locking a PCI bulkhead to a computer chassis bay, the latch comprising:
   a shoulder defining a longitudinal axis;
   a handle extending outwardly from the shoulder and defining a front, a back, and a bottom;
   an engagement body extending from the bottom of the handle opposite the shoulder; and
   a biasing member extending outwardly from the shoulder adjacent the back of the handle and including an intermediate section configured to compress onto itself and a trailing section configured to selectively engage a wall of the chassis bay;
   wherein the latch is configured to be rotatable about the longitudinal axis between an unlocked position and a locked position in which the engagement body engages the bulkhead with the intermediate section of the biasing member biasing the trailing section to lodge against the chassis bay such that the biasing member resists movement from the locked position.

2. The latch of claim 1, further comprising:
   a stop member extending outwardly from the shoulder and circumferentially spaced from the handle and the biasing member, the stop member configured to contact a wall of the chassis bay in the locked position.

3. The latch of claim 2, wherein the stop member includes a guard plate radially positioned relative to a radial position of the handle so as to selectively contact an actuator device in the locked position.

4. The latch of claim 1, wherein the shoulder defines a central passage extending along the longitudinal axis, the central passage sized to receive a coupling device for mounting the latch to the chassis bay.

5. The latch of claim 1, wherein the engagement body extends rearwardly relative to the back of the handle.

6. The latch of claim 5, wherein the engagement body further includes a heel formed at a bottom thereof for selectively engaging the bulkhead, the heel being spaced from the back of the handle.

7. The latch of claim 1, wherein the intermediate section of the biasing member is U-shaped.

8. The latch of claim 1, wherein the biasing member is configured such that upon final assembly of the latch to the chassis, a greater force is required to move the latch from the locked position then to move the latch from the unlocked position.

9. The latch of claim 1, wherein the biasing member provides a cam surface configured to engage a wall of the chassis, the cam surface configured to cause the intermediate section to initially compress from a natural state as the latch is transitioned from either the unlocked position or the locked position.

10. The latch of claim 9, wherein the cam surface is further configured to allow the intermediate section to deflect back toward the natural state upon achieving the locked position.

11. The latch of claim 9, wherein the cam surface is defined as a corner formed by respective outer surfaces of the intermediate section and the trailing section.

12. The latch of claim 1, wherein the intermediate section includes a first leg extending from the shoulder and a second leg extending from the first leg, the trailing section extending from the second leg, and further wherein respective outer surfaces of the second leg and the trailing section are non-planar such that the second leg biases the outer surface of the trailing section against a wall of the chassis in the locked state.

13. The latch of claim 1, wherein the latch is sized for placement within a 3 U chassis.

14. An enclosure device for a PCI computer system, the device comprising:
   a chassis;
   a card bay formed by the chassis and defining a plurality of card slots and an outer frame portion including a base wall and a sidewall extending in an perpendicular fashion from the base wall; and
   a latch secured to the base wall adjacent one of the slots, the latch including:
      a shoulder defining a longitudinal axis,
      a handle extending outwardly from the shoulder and defining a front, back, and bottom,
      an engagement body extending from the handle bottom, opposite the shoulder,
      a biasing member extending outwardly from the shoulder adjacent the handle back and including a compressible intermediate section and a trailing section;
   wherein the latch is configured to be rotatable about the longitudinal axis between an unlocked position and a locked position in which the engagement body locks a PCI bulkhead to the base wall with the trailing section of the biasing member lodged against the sidewall such that the biasing member resists movement from the locked position.

15. The device of claim 14, wherein the latch further includes:
   a stop member extending outwardly from the shoulder and circumferentially spaced from a handle and the biasing member, the stop member configured to contact the sidewall of the chassis in the locked position.

16. The device of claim 14, wherein the engagement body extends rearwardly relative to the back of the handle.

17. The device of claim 16, wherein the engagement body further includes a heel formed at a bottom thereof for selectively engaging the bulkhead, the heel being spaced from the back of the handle.

18. The device of claim 14, wherein the biasing member provides a cam surface configured to engage the sidewall of the chassis, the cam surface adapted to cause the intermediate section to initially compress from a natural state as the latch is transitioned from either the unlocked position or the locked position.

19. The device of claim 14, wherein the chassis has a height of 3 U.

20. The device of claim 14, wherein the PCI computer system is adapted such that at least one of the slots is hot pluggable and at least another one of the slots is not hot pluggable, and further wherein the latch is color coded to signify whether the slot associated with the latch is hot pluggable.

* * * * *